US008680857B2

(12) United States Patent
Phan Le et al.

(10) Patent No.: US 8,680,857 B2
(45) Date of Patent: Mar. 25, 2014

(54) MAGNETORESISTIVE SENSOR

(75) Inventors: Kim Phan Le, Eindhoven (NL);
Frederik Willem Maurits Vanhelmont,
Maaseik (BE); Jaap Ruigrok, Asten
(NL); **Andreas Bernardus Maria
Jansman, Nuenen (NL); Robert
Hendrikus Margaretha van Veldhoven**,
Dommelen (NL)

(73) Assignee: NXP B.V., Eindhoven (NL)

( * ) Notice: Subject to any disclaimer, the term of this patent is extended or adjusted under 35 U.S.C. 154(b) by 204 days.

(21) Appl. No.: 13/191,730

(22) Filed: Jul. 27, 2011

(65) Prior Publication Data

US 2012/0025819 A1     Feb. 2, 2012

(30) Foreign Application Priority Data

Jul. 30, 2010   (EP) .................................... 10171416

(51) Int. Cl.
*G01R 33/02*     (2006.01)
(52) U.S. Cl.
USPC ..................................... 324/252; 324/207.21
(58) Field of Classification Search
USPC ........................................... 324/207.21, 252
See application file for complete search history.

(56) References Cited

U.S. PATENT DOCUMENTS

2002/0005717 A1    1/2002    Spitzer et al.
2011/0285395 A1    11/2011   van Veldhoven et al.

FOREIGN PATENT DOCUMENTS

EP    2 330 432 A1    6/2011
WO    2009/040693 A2  4/2009
WO    2010/052664 A2  5/2010

OTHER PUBLICATIONS

Extended European Search Report for European Patent Appln. No. 10171416.0 (Dec. 1, 2010).

*Primary Examiner* — Reena Aurora

(57) ABSTRACT

A magnetoresistive sensor comprising first and second magnetoresistive elements is disclosed. Each magnetoresistive element is coupled at a respective first end to a common ground terminal and comprises one or more magnetoresistive segments, each overlying a corresponding segment of an excitation coil. The resistance of the magnetoresistive segments in each of the first and second magnetoresistive elements is the same and the resistance of the segments of the excitation coil corresponding to the first magnetoresistive element is the same as the resistance of the segments of the excitation coil corresponding to the second magnetoresistive element.

14 Claims, 10 Drawing Sheets

US 8,680,857 B2

MAGNETORESISTIVE SENSOR

This application claims the priority under 35 U.S.C. §119 of European patent application no. 10171416.0, filed on Jul. 30, 2010, the contents of which are incorporated by reference herein.

FIELD OF THE INVENTION

This invention relates to a magnetoresistive sensor.

BACKGROUND OF THE INVENTION

Anisotropic magnetoresistive (AMR), or simply magnetoresistive (MR), sensors are used in a variety of automotive applications. They are used, for example, as angular sensors in throttle valves, rotational speed sensors in Automatic Breaking Systems (ABS), automated and automatic transmission systems, and as motion sensors in security systems.

Recently there has been a demand to miniaturise the sensors and to reduce their cost, while improving performance to compete with giant magnetoresistive (GMR) technology. The largest element of a conventional AMR rotational speed sensor is the biasing magnet which is glued on the outside of the package. This biasing magnet is also rather costly. It is used to provide a bias magnetic field to the sensor, stabilise magnetic domains, and prevent magnetisation flipping. AMR sensors are often also provided with metal lines running over the elements, known as barber poles, which serve to linearise the sensor signal.

There have been several proposals for performing these functions without requiring a biasing magnet. These proposals include the superheterodyne and differential superheterodyne principles in which an alternating current (a.c.) excitation field created by an integrated coil in a direction perpendicular to the sensor strips (the Y direction) is mixed with the a.c. external field (to be measured) using the non-linear characteristic of the mganetoresistive sensor elements. The coil is a layer of a straight conductor that lies directly above the magnetoresistive elements, separated by a thin non-magnetic insulator layer. It creates a magnetic field in the plane of the magnetoresistive sensor elements, in a direction perpendicular to their longitudinal axis.

FIG. 1 shows such a sensor comprising a lower layer with three parallel rows of three magnetoresistive segments 1 electrically connected in series by connections 2, and an upper layer (separated from the lower layer) in which a coil 3 is formed. The magnetic field generated by the coil is shown by the arrows marked "H" and can be seen clearly in the cross-section. To generate the magnetic field, an a.c. excitation current is passed through the coil 3. One end of the magnetoresistive element is coupled to ground and the other end is coupled to an output terminal.

In the superheterodyne principle, an a.c. excitation current, having a frequency about 10 times higher than that of the external field to be detected, is caused to flow through the coil to create an a.c. excitation field on the magnetoresistive sensor elements. This field is mixed with the external field inside the magnetoresistive elements (by virtue of their quadratic transfer function-resistance change is a quadratic function of the applied magnetic field in the Y direction).

After mixing, the resulting signal has a spectrum with components d.c. and at frequencies of $\omega_{exc}-\omega_{ext}$, $\omega_{exc}+\omega_{ext}$ and $2\omega_{exc}$ (where $\omega_{ext}$ and $\omega_{exc}$ denote the frequencies of the external field to be detected and of the excitation field created by the coil respectively). After filtering out the frequency component at $2\omega_{exc}$, the signal contains the spectrum components at $\omega_{exc}-\omega_{ext}$ and $\omega_{exc}+\omega_{ext}$, which convey the useful information. The signal is then mixed again with a signal at a suitable frequency to bring one of these two components into a base-band frequency range, and the signal corresponding to the external field can then be extracted easily.

In the differential superheterodyne principle, two sensor arrangements identical to those of the superheterodyne principle are placed close to each other and the excitation currents flowing in the two coils are opposite in direction in order to create a 180 degree phase difference in the excitation magnetic field. After mixing in the magnetoresistive elements, signals from the two sensor arrangements are subtracted to result in a signal that contains only the two side-band components $\omega_{exc}-\omega_{ext}$ and $\omega_{exc}+\omega_{ext}$ and the direct current (d.c.) component. The useful information can be extracted in the same way as in the superheterodyne principle (i.e. by mixing), without having to use band-pass filters.

For both superheterodyne and differential superheterodyne methods, the useful information is conveyed by the two components $\omega_{exc}-\omega_{ext}$ and $\omega_{exc}+\omega_{ext}$. It is very important that there should be no interfering frequency components getting into or close to this bandwidth.

These methods have a number of advantages. For example, they are highly sensitive, no bias magnet or barber poles are needed, the output signal has no offset, they are independent of temperature, and they have a wide dynamic range of input field magnitude.

However, there is a problem with both the superheterodyne and differential superheterodyne methods. Specifically, there is a strong frequency component at ωexc, which lies in the middle of the two useful components ωexc−ωext and ωexc+ωext and does not contain useful information. This interfering component appears due to unwanted capacitive and/or inductive coupling between the coil and the magnetoresistive elements.

An illustration of the mechanism leading to capacitive coupling is shown in FIG. 2. A source 4 sends an a.c. excitation current through the coil 3, and a source 5 sends a d.c. bias current through the magnetoresistive element. The a.c. signal in the coil 3 is coupled via the capacitance between the coil 3 and the magnetoresistive element (shown as three discrete capacitors rather than a distributed capacitance in FIG. 2 for ease of illustration), giving rise to an a.c. leakage current in the magnetoresistive element. This current finds its way to ground by passing through the resistance of the magnetoresistive segments 1, giving an unwanted a.c. voltage contribution to the output voltage at the output terminal, $V_A$.

An illustration of the mechanism leading to inductive coupling is shown in FIG. 3. The a.c. signal in the coil gives rise to an a.c. voltage contribution throughout the magnetoresistive element due to the mutual inductance between the coil 3 and magnetoresistive element. This unwanted a.c. voltage adds to, and interferes with, the wanted signal at the magnetoresistive element output terminal.

Another problem is electrical mismatch between the coils in the differential superheterodyne principle. This principle only works when the phases of the excitation magnetic field created by the two coils are exactly in anti-phase. However, in practice, it is difficult to fulfil this requirement, due to impedance mismatch between the coils.

It has been proposed to drive the magnetoresistive sensor with an a.c. current that has the same frequency and phase as the excitation current in the coil. In principle, this could cancel the capacitive coupling because at corresponding points along the coil and the magnetoresistive element there is no potential difference. However, in practice it is extremely difficult to provide good phase matching because the impedance of the coil and the magnetoresistive element are not the same.

SUMMARY OF THE INVENTION

According to a first aspect of the invention, there is provided a magnetoresistive sensor comprising first and second magnetoresistive elements, each of which is coupled at a respective first end to a common ground terminal and comprises one or more magnetoresistive segments, each overlying a corresponding segment of an excitation coil, wherein the resistance of the magnetoresistive segments in each of the first and second magnetoresistive elements is the same and the resistance of the segments of the excitation coil corresponding to the first magnetoresistive element is the same as the resistance of the segments of the excitation coil corresponding to the second magnetoresistive element.

The resistances of the first and second magnetoresistive elements and the corresponding coil segments are effectively symmetrically distributed about the common ground terminal. Therefore, for each point on the first magnetoresistive element there exists a corresponding point on the second magnetoresistive element that has effectively the same impedance to the common ground terminal. The local capacitance per unit length between the coil and each of the magnetoresistive elements is also the same. In use, the coil may be electrically driven so that any capacitively coupled currents will be identical in each of the two magnetoresistive elements and flow symmetrically to the common ground terminal. Thus, because the resistance of the magnetoresistive segments in each magnetoresistive element is the same, the capacitively coupled currents will cause the same voltage drop to appear on each magnetoresistive element relative to the common ground point. The two voltage drops therefore cancel.

Furthermore, the magnetic coupling per unit length is effectively symmetrically distributed: for each point on the first magnetoresistive element there exists a location on the second magnetoresistive element which has effectively the same degree of magnetic coupling per unit length with the coil. Thus the voltage drops caused by inductive coupling due to mutual inductance will be the same in each magnetoresistive element and will similarly cancel.

The common ground point is not necessarily coupled to a d.c. potential of zero volts, although it may be. It is simply any point that represents a ground for the a.c. excitation current flowing in the coil. Indeed, it need not be coupled to any particular potential, but could be left floating and assume ground potential due to the symmetry of layout of the two magnetoresistive elements.

With respect to the magnetoresistive segments overlying corresponding segments of the excitation coil, it is irrelevant to the operation of the invention whether the magnetoresistive segments lie above the coil or vice-versa. The term "overlying" is intended to cover both possibilities. The essence is that a current through the coil induces a field parallel to the magnetic field to be measured by the sensor.

Typically, the first and second magnetoresistive elements are identical. Thus, they have an identical layout. This is an effective way to obtain the required symmetry of impedance for the two magnetoresistive elements and symmetry of capacitive and inductive coupling between the two magnetoresistive elements and the coil.

Normally, a second end of each of the first and second magnetoresistive elements is coupled to respective first and second output terminals.

In one embodiment, a bias current source for providing a bias current in the first and second magnetoresistive elements is coupled between the first and second output terminals.

In another embodiment, first and second bias current sources for providing a bias current in each of the first and second magnetoresistive elements respectively are coupled between the common ground terminal and a respective one of the first and second output terminals.

The excitation coil may comprise first and second excitation coil elements electrically coupled in parallel, the magnetoresistive segments of the first and second magnetoresistive elements overlying a respective one of the first and second excitation coil elements.

Alternatively, the excitation coil may comprise a single excitation coil element. Thus, the segments of the excitation coil will all be coupled in series.

The excitation coil may be coupled at each end to an excitation current source for providing excitation current in the coil. This is one way in which the coil may be electrically driven so that any capacitively coupled currents will be identical in each of the two magnetoresistive elements and flow symmetrically to the common ground terminal, as mentioned above.

Alternatively, the excitation coil may be coupled at a midpoint along its length to a ground terminal. In this case, first and second excitation current sources for providing excitation current in the coil are coupled between the ground terminal and respective ends of the excitation coil. If the coil comprises first and second excitation coil elements electrically coupled in parallel then each of these elements will have a midpoint that is coupled to the ground terminal.

In a first embodiment, each of the first and second magnetoresistive elements comprises the same number of magnetoresistive segments configured such that adjacent magnetoresistive segments in the same magnetoresistive element conduct a bias current in opposing directions, in use, and the excitation coil is configured such that each of its segments conduct an excitation current in the same direction, in use.

In a second embodiment, the first and second magnetoresistive elements comprise the same even number of magnetoresistive segments arranged in pairs, the magnetoresistive segments being configured such that each segment in a pair conducts a bias current in opposing directions, in use, and the excitation coil is configured such that the segments corresponding to the magnetoresistive segments of the first magnetoresistive element conduct an excitation current, in use, in an opposing direction to the segments corresponding to the magnetoresistive segments of the second magnetoresistive element.

In the second embodiment (when a second end of each of the first and second magnetoresistive elements is coupled to respective first and second output terminals), the first end of the first magnetoresistive element may be coupled to the common ground terminal via a first ballast resistor and the second end of the second magnetoresistive element may be coupled to the second output terminal via a second ballast resistor.

In this case, the first and second ballast resistors preferably have the same resistance value. The value of the ballast resistors, $R_{ballast}$, is typically calculated using the following formula:

$$R_{ballast} = \frac{2nRV_d}{V_{MR} - V_d}$$

In this formula, n is the number of pairs of segments in each magnetoresistive element, R is the resistance of one segment in a pair, Vd is the voltage drop across one segment of the coil and VMR is the voltage difference over the full length of the magnetoresistive elements (i.e. the bias current times the sum of the resistances of the first and second magnetoresistive elements).

In accordance with a second aspect of the invention, there is provided a magnetoresistive sensor comprising a magnetoresistive element, coupled at a first end to a ground terminal and comprising one or more pairs of magnetoresistive segments, each overlying a corresponding segment of an excitation coil, wherein the excitation coil is configured such that, in use, an excitation current flows in the same direction through each segment of the excitation coil and the or each pair of magnetoresistive segments is configured such that a bias current flows in opposite directions in each magnetoresistive segment of the pair.

By ensuring that the excitation current flows in the same direction through each segment of the excitation coil and that the bias current flows in opposite directions in each magnetoresistive element of a pair, the voltage drops in each pair of magnetoresistive segments caused by inductive coupling have opposite polarity. They therefore cancel.

In both the first and second aspects, the or each magnetoresistive element may be separated from a carrier substrate by an isolation layer, the thickness of the isolation layer being selected such that the product of the total resistance of the or each magnetoresistive element and the capacitance between the or each magnetoresistive element and the substrate is less than the reciprocal of the highest frequency in the spectrum of an excitation current carried by the excitation coil.

BRIEF DESCRIPTION OF THE DRAWINGS

Examples of the invention will now be described in detail with reference to the accompanying drawings, in which.

DETAILED DESCRIPTION OF EMBODIMENTS

Figure 4:
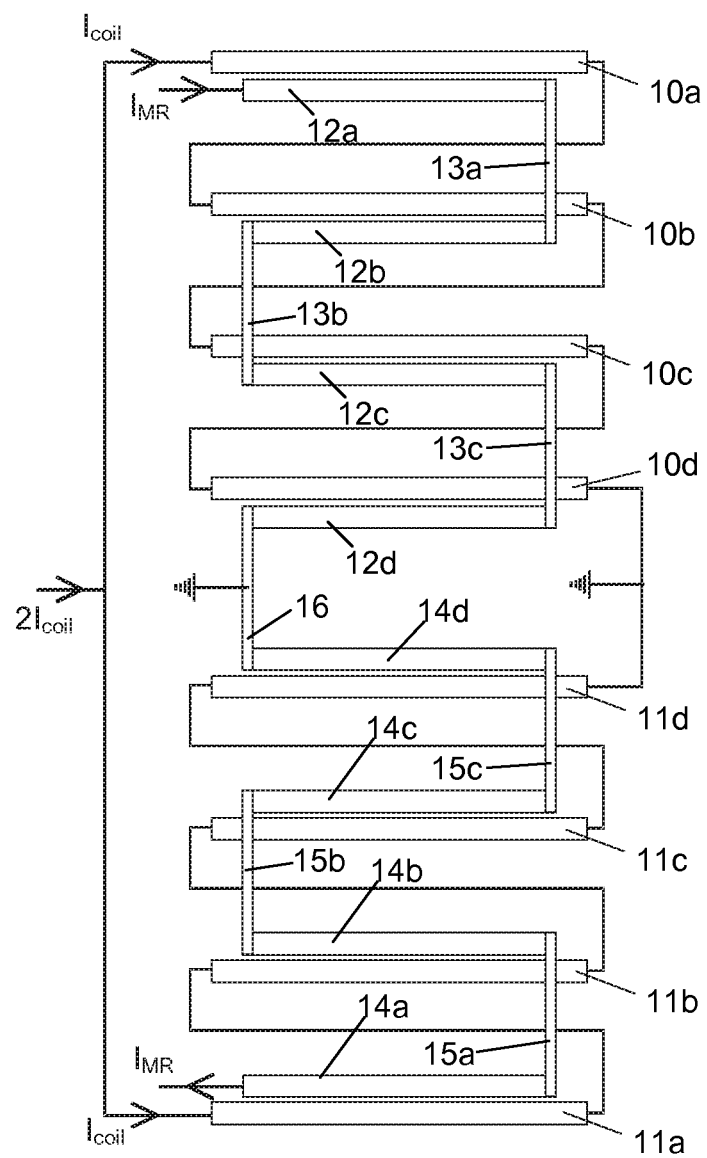
FIG. 4 shows a sensor according to a first embodiment of the invention using the superheterodyne principle.

In FIG. 4 a sensor layout according to a first embodiment of the invention is shown. In this figure, for ease of illustration and understanding, the coil segments are drawn next to the corresponding magnetoresistive segments of the sensor elements. It should be understood that in reality these two rows are above each other, although it is immaterial whether the magnetoresistive segments are above the coil segments or vice-versa.

In the layout of FIG. 4, the coil is split into two mirrored current branches. Each of these two branches is arranged in the form of a meander and carries an equal current, $I_{coil}$, which flows to a common ground terminal at their junction. The first branch comprises coil segments 10a, 10b, 10c and 10d, and the second branch comprises coil segments 11a, 11b, 11c and 11d. The segments 10a-10d and 11a-11d in each branch are coupled together so that the excitation current flows in the same direction (as denoted by the arrow marked $I_{coil}$) through each segment. The excitation current causes a magnetic field to be generated parallel to the plane in which the magnetoresistive elements lie.

Above each of the coil segments 10a-10d and 11a-11d lies a corresponding segment of a first and second magnetoresistive element. Thus, the segments 12a-12d of the first magnetoresistive element lie above corresponding coil segments 10a-10d. The segments 12a-12d are coupled together by connecting elements 13a-13d such that the bias current, $I_{MR}$, flows in opposing directions in each of adjacent segments 12a-12d of the first magnetoresistive element.

Similarly, the segments 14a-14d of the second magnetoresistive element lie above corresponding coil segments 11a-11d. The segments 14a-14d are coupled together by connecting elements 15a-15d such that the bias current, $I_{MR}$, flows in opposing directions in each of adjacent segments 14a-14d of the second magnetoresistive element.

The first and second magnetoresistive elements are coupled together by connecting element 16, which is itself coupled to an a.c. ground point, typically a fixed d.c. potential such as 0V.

The first and second magnetoresistive elements are biased with opposite polarities so that the bias current flows in opposing directions in corresponding magnetoresistive segments in each of the two elements. For example, the bias current flows in opposite directions in segments 12d and 14d.

Each segment 12a-12d and 14a-14d of the first and second sensor elements is drawn as a single piece for the sake of simplicity; but in fact, each segment may contain more than one sub-segment connected by short connection bars.

Figure 5:
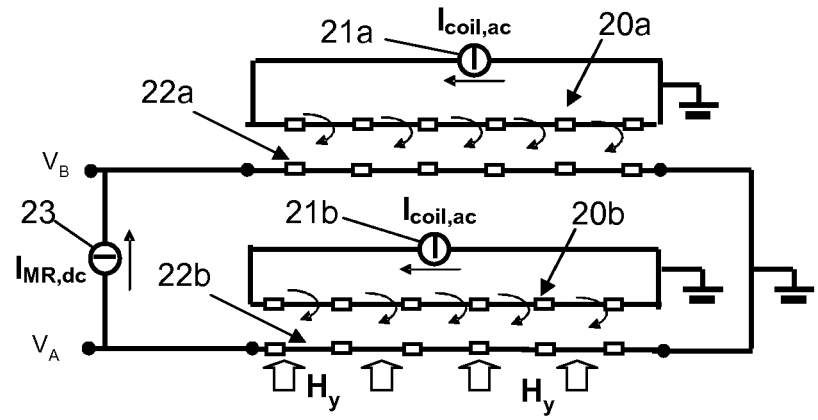
FIG. 5 shows schematically the current flows in the sensor of FIG. 4.

In FIG. 5, a schematic representation of the sensor of the first embodiment is shown. The topology consists of two branches, as in FIG. 4. The first branch comprises a first coil element 20a and the first magnetoresistive element 22a, and the second branch comprises a second coil element 20b and the second magnetoresistive element 22b. The coil elements 20a, 20b as well as the first and second magnetoresistive elements 22a, 22b are depicted next to each other as a row of resistors. The excitation current is provided by current sources 21a and 21b, each of which provides a current of $I_{coil}$. Thus, the same current flows through each branch as in FIG. 4. In FIG. 5 the currents in the two branches originate from two sources, although in FIG. 4 the current is generated by a single source providing $2I_{coil}$, which is split into the two parallel branches. Functionally, this does not make any difference. Each of the two coil branches is connected at one end to an a.c. ground.

The first and second magnetoresistive elements 22a and 22b are coupled together at one end, which is coupled to a.c. ground. The a.c. ground does not necessarily have to be at a level of zero volts d.c. The requirement is simply that, for the frequencies present in the a.c. excitation current, the ground node can be regarded to be at zero voltage. For example, if the node is at a constant voltage of 10 V, it will still be grounded for the high frequency a.c. excitation current. Furthermore, the ground need not be coupled to a fixed potential point. If it is floating, the node may also be an a.c. ground (for example, due to symmetry in the layout).

A source 23 of d.c. bias current is connected across the other two ends of the first and second magnetoresistive elements 22a and 22b, which represent the output terminals of the sensor. The output signal from the sensor is the voltage difference, $V_B-V_A$, between these two output terminals.

A requirement of the superheterodyne principle is that the first and second magnetoresistive elements 22a and 22b should react in the same way to the external field, $H_y$, and the excitation field from the coil, indicated by the arrows in FIG. 5. That is, in this case, the resistance in both elements 22a and 22b should change synchronously. This requirement is satisfied by the topology of FIG. 5 because the coil current flows in the same direction for the two coil branches 20a and 20b. This generates an excitation magnetic field of the same direction in both the first and second magnetoresistive elements 22a and 22b with respect to the external field, $H_y$.

Simulation results show that the circuit of FIG. 5 is indeed sensitive to applied magnetic fields. When no external magnetic field is applied, the output voltage is simply sinusoidal. However, when an external magnetic field is applied, the output signal consists of a slowly varying and a quickly varying signal, corresponding to the frequency components $\omega_{exc}-\omega_{ext}$ and $\omega_{exc}+\omega_{ext}$ respectively. There is no component at $\omega_{exc}$, showing that the effects of capacitive and inductive coupling between the coil and the magnetoresistive elements have been cancelled.

Figure 6:
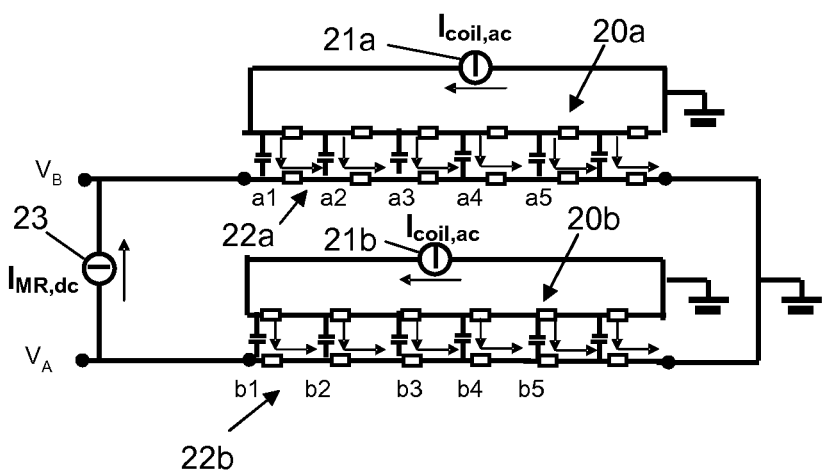
FIG. 6 shows the mechanism by which capacitive coupling is cancelled in the sensor of FIG. 4.

The mechanism for cancellation of capacitive coupling will now be explained with reference to FIG. 6, which shows the same circuit as FIG. 5 with the parasitic capacitances and associated leakage currents highlighted (see the capacitors between the coil branches 20a and 20b and the first and second magnetoresistive elements 22a and 22b and the adjacent arrows).

Due to the a.c. voltage difference between the coil branches 20a, 20b and the respective magnetoresistive elements 22a, 22b, capacitive leakage currents arise magnetoresistive segments 12a-12d, 14a-14d overlie the coil segments 10a-10d, 12a-12d. These currents seek their way to ground through the resistance of the magnetoresistive elements and lead to voltage drops between the nodes a1-a5 and b1-b5. However, due to the symmetry of the layout, the voltage drop between nodes a1 and a2 is exactly compensated by the voltage drop between b1 and b2. Similarly, the voltage drop between nodes a2 and a3 cancel with that between b2 and b3, and so on. In this way, the capacitive coupling is cancelled entirely and has no effect on the output voltage $V_B-V_A$.

The cancellation of capacitive coupling has been confirmed by circuit simulations. In this simulation, the applied field was set to zero and the co-efficient of inductive coupling was also set to zero. Any output voltage was therefore due entirely to capacitive coupling. Whilst a sinusoidal voltage swing was present on each output terminal (i.e. $V_A$ and $V_B$ were both sinusoidal), the voltage difference $V_B-V_A$ was zero, indicating that the capacitive coupling had been effectively cancelled.

For full compensation, symmetry of the two branches (i.e. both the coil branches and the magnetoresistive elements) is essential. Thus, the resistance of the first and second magnetoresistive elements between the ground terminal and their respective output terminals must be the same and each segment of the magnetoresistive elements must overlie a corresponding coil segment. This ensures that the leakage currents at either side are equal. Both the magnetoresistive elements and the coil branches should be symmetrically arranged about the a.c. ground, and the coil current in each branch should be the same.

Figure 7:
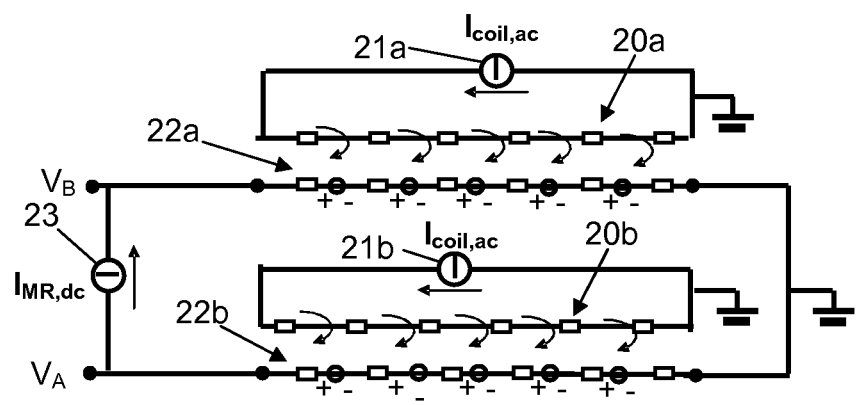
FIG. 7 shows the mechanism by which inductive coupling is cancelled in the sensor of FIG. 4.

The sensor of the first embodiment also provides compensation for inductive coupling. The mechanism for compensation is shown in FIG. 7. The inductive coupling is represented by local voltage sources in the first and second magnetoresistive elements 22a and 22b. Since the currents in the coil branches 20a and 20b are in phase, so are the voltages generated in the first and second magnetoresistive elements 22a and 22b by inductive coupling. The inductively-generated voltages are therefore the same in each of the first and second magnetoresistive elements 22a and 22b. They therefore cancel in the output signal $V_B-V_A$. This compensation has been confirmed by simulation.

For efficient compensation of inductive coupling, the currents in the two coil branches 20a and 20b should be equal in amplitude and in-phase, and the coupling co-efficient (i.e. the mutual inductance) between each coil branch 20a and 20b and the associated magnetoresistive element 22a and 22b should be the same.

Figure 8:
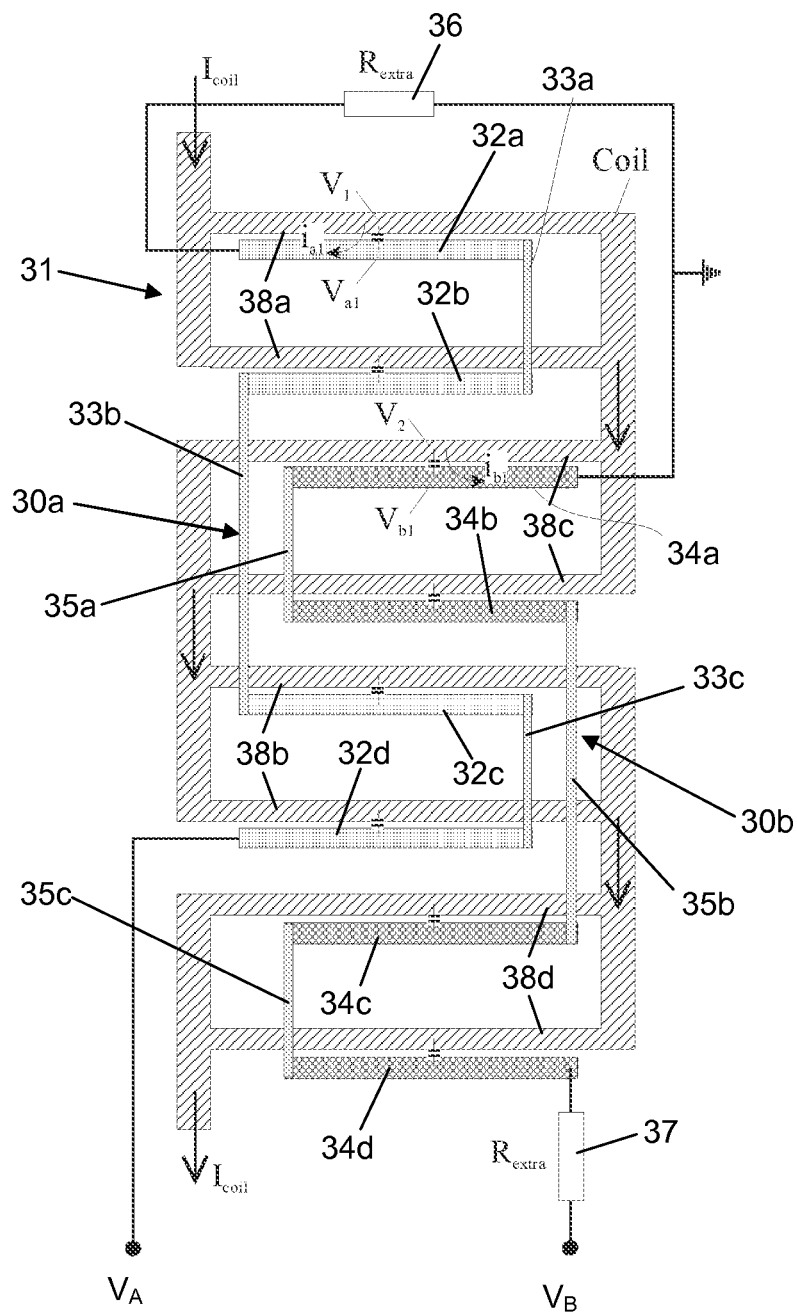
FIG. 8 shows a sensor according to a second embodiment of the invention using the differential superheterodyne principle.

FIG. 8 shows the layout of a second embodiment, which makes use of the differential superheterodyne principle. In this, there are two sensor elements 30a and 30b, interleaving with each other as shown. By interleaving the two sensor elements 30a and 30b, the overall space occupied by the sensor is minimised while the matching between them (in terms of resistance) is maximized. The same coil 31 is used to generate the excitation field for both sensor elements 30a and 30b.

The first sensor element 30a comprises four segments 32a, 32b, 32c and 32d, coupled together by connection elements 33a, 33b and 33c. The segments 32a-32d are coupled such that a d.c. bias current flows in opposing direction in adjacent segments.

Similarly, the second sensor element 30b comprises four segments 34a, 34b, 34c and 34d, coupled together by connection elements 35a, 35b and 35c. The segments 34a-34d are coupled such that a d.c. bias current flows in opposing direction in adjacent segments.

One end of segment 34a is coupled to an a.c. ground terminal, and one end of segment 32a is coupled to the ground terminal through a resistor 36. At the other end of the first and second sensor elements 30a, 30b, one end of segment 32d is coupled to a first output terminal and one end of segment 34d is coupled to a second output terminal through resistor 37. The values of resistors 36 and 37 are the same and are chosen as explained below.

The current flows through the coil 31 from the top to the bottom. As it does so, it meanders left and right underneath the two sensor elements 30a, 30b. This causes the coil 31 to create magnetic field for the first magnetoresistive element 30a of a first phase when it passes through coil elements 38a, 38b, and to create magnetic fields exactly 180 out of phase with the first phase for the second magnetoresistive element 30b when it passes through coil elements 38c, 38d.

Figure 1:
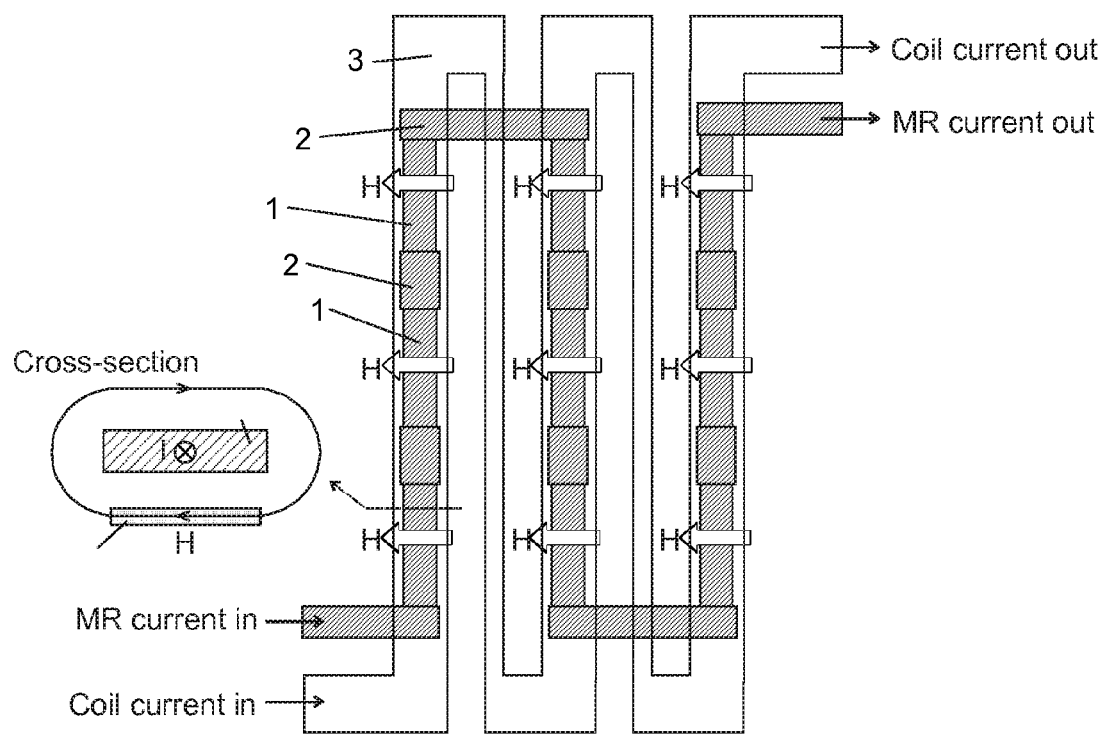
FIG. 1 shows the layout of a prior art sensor using the superheterodyne principle.
Figure 2:
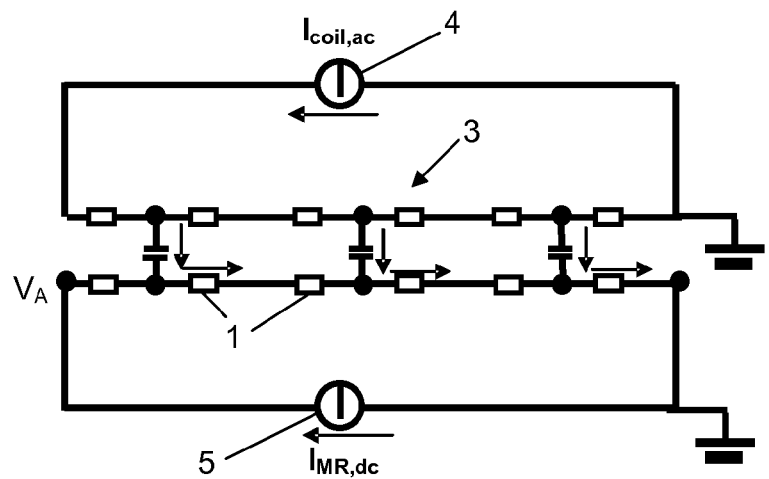
FIG. 2 shows the mechanism for unwanted capacitive coupling in the prior art sensor of FIG. 1.
Figure 3:
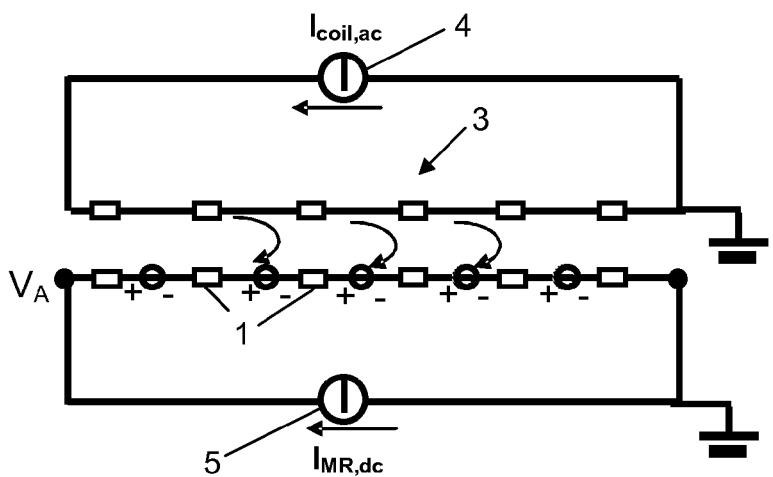
FIG. 3 shows the mechanism for unwanted inductive coupling in the prior art sensor of FIG. 1.

This arrangement of the coil 31 has two advantages. First, the fields generated for both the first and second magnetoresistive elements 30a, 30b are created by the same current flow. Therefore the phase matching between the generated fields is perfect. Second, all segments of the coil 31 are used, resulting in better power efficiency compared to, for example, the coil of FIG. 1, where the fields generated by the return segments of the coil 3 are not used.

To ensure the capacitive coupling is perfectly cancelled, two ballast resistors 36, 37 of the same value $R_{ballast}$ are provided, as discussed above and shown in FIG. 20. The two ballast resistors 36, 37 can be integrated in the sensor die, or can be in the external readout circuit. The role of each of these resistors in assisting compensation for capacitive coupling is set out below.

By way of example, the upper one of coil segments 38a will be considered. As shown in FIG. 8, the potential in the middle of the upper on of coil segments 38a is $V_1$, and the potential in the middle of the corresponding segment 32a of the first magnetoresistive component is $V_{a1}$. The a.c. leakage current from the coil to segment 32a due to the capacitive coupling at this point is $i_{a1}=(V_1-V_{a1})\omega C$, in which $\omega$ is the frequency of the coil current and C is the coupling capacitance.

Further down the coil 31, at the first segment of the second magnetoresistive element 34a, the potential of the coil is lower due to a voltage drop $V_d$ from the segments 38a to the segments 38c of the coil. The a.c. leakage current at this point is $i_{b1}=(V_1-V_d-V_{b1})\omega C$.

If there were no ballast resistors 36 and 37, $V_{a1}$ would equal $V_{b1}$. If all leakage currents of all segments 32a-32d and 34a-34d of the first and second magnetoresistive elements 30a and 30b are summed up, the total leakage currents from the two sensor elements 30a and 30b would be unbalanced. Therefore, the compensation would not work.

The ballast resistor 36 reduces the voltage difference between the first segments 38a of the coil 31 and the segment 32a of the first magnetoresistive element 30a. To make the resistance of the two magnetoresistive elements 30a, 30b equal (for the balance of the readout circuit), another ballast resistor 37 is required, as shown, for the second magnetoresistive element 30b.

In order to have perfect cancellation, the value of the ballast resistors 36 and 37 should be:

$$R_{ballast} = \frac{2nRV_d}{V_{MR} - V_d}$$

where n is the number of pairs of segments in each magnetoresistive element, R is the resistance of one segment in a pair, Vd is the voltage drop across one segment of the coil and VMR is the voltage difference over the full length of the magnetoresistive elements (i.e. the bias current times the sum of the resistances of the first and second magnetoresistive elements).

In the layout of FIG. 8, the two sensor elements 30a, 30b are interleaved: they wind over each other. In an alternative layout they could be placed next to each other, which would save on crossovers. However, the interleaved layout is preferred because spatial process variations would then affect sensor elements 30a, 30b in the same way, so the symmetry between the two elements 30a, 30b is maintained.

In order to reduce the number of times the coil traverses across the width of the substrate on which it is placed, the coil current is split as it passes each adjacent pair of segments 32a-32d and 34a-34d of the sensor elements 30a, 30b. This is done by providing the parallel coil segments 38a, 38b, 38c and 38d. In a special case, when each sensor element consists of only one pair of segments, the current would not need to be split to minimise the number of traversals.

The advantage of such a layout is that with the same current, the field generated can be doubled, or in other words, to generate the same field, only half the current is required. In this case the power consumption for the coil can be reduced by a factor of two (the current reduces by a factor of two and the resistance increases by a factor of two; thus power consumption, being $I^2R$, is reduced by a factor of two overall). The two ballast resistors are still required.

Furthermore, for such a small device one may consider to place the two meanders next to each other instead of in an interleaved layout, because spatial process variations will be small over these small dimensions.

Figure 9:
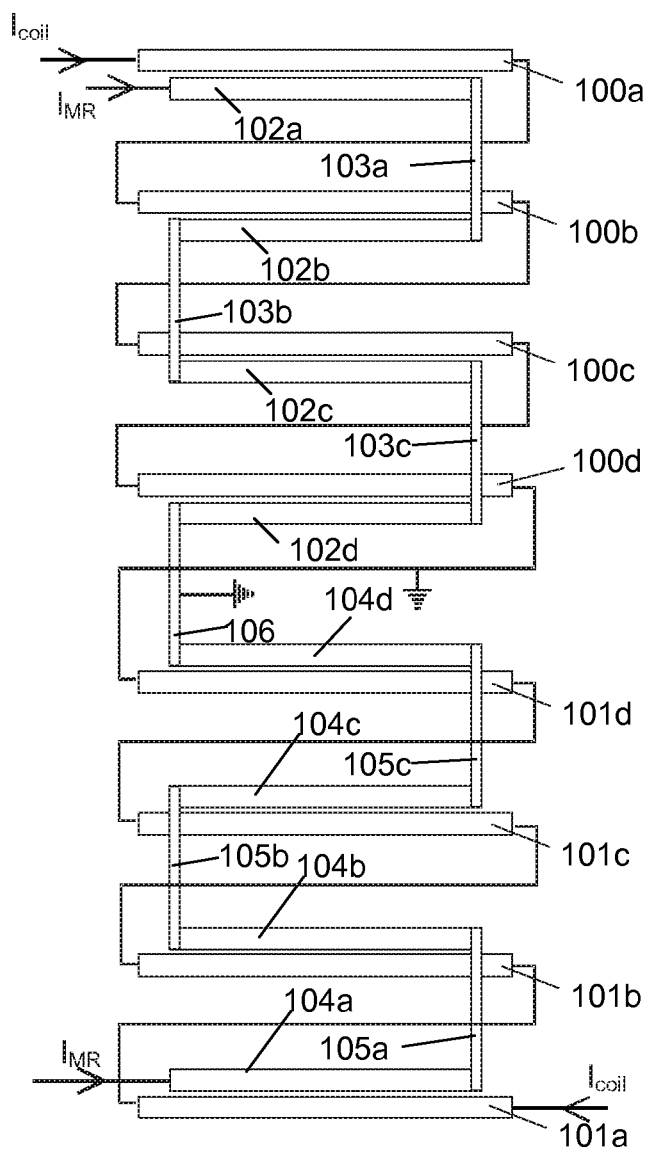
FIG. 9 shows a sensor according to a third embodiment of the invention using the differential superheterodyne principle.

In FIG. 9 an alternative sensor layout is shown, using the differential superheterodyne principle. The topology is similar to the topology in FIG. 4, except for the directions of the currents in the coil and the magnetoresistive elements for the lower half of the circuit.

The sensor of FIG. 9 comprises a top set of coil segments 100a, 100b, 100c and 100d and a bottom set of coil segments 101a, 101b, 101c and 101d. The segments 100d and 101d are coupled to a ground terminal at their junction. The sensor also comprises two magnetoresistive elements. The first element is made up of four segments 102a, 102b, 102c and 102d coupled together by connecting elements 103a, 103b, 103c and 103d. The second element is made up of segments 104a, 104b, 104c and 104d coupled together by connecting elements 105a, 105b, 105c and 105d. The two elements are coupled by connecting element 106, which couples segments 102d and 104d. Connecting element 106 is also coupled to ground.

Regarding the current in the magnetoresistive elements, in FIG. 4 a current $I_{MR}$ flows through segments 12a to 12d to the ground terminal, and a current $I_{MR}$ flows from the ground terminal through segments 14d to 14a. In FIG. 9, on the other hand, respective currents $I_{MR}$ flow through each set of segments 102a to 102d and 104a to 104d to the ground terminal.

Regarding the current in the coil segments in FIG. 4, the current $I_{coil}$ flows in the same direction (i.e. left-to-right or right-to-left) at any given moment in time in all of the segments 10a to 10d and 11a to 11d. In FIG. 9, the situation is different. For the top segments 100a to 100d the coil current runs in the opposite direction to the bottom half segments 101a to 101d.

Figure 10A:
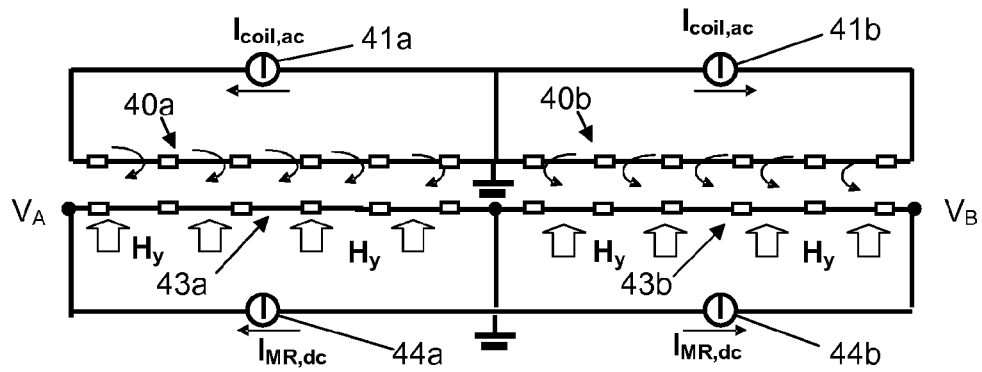
FIGS. 10a and 10b show schematically the current flows in the sensor of the third embodiment.
Figure 10B:
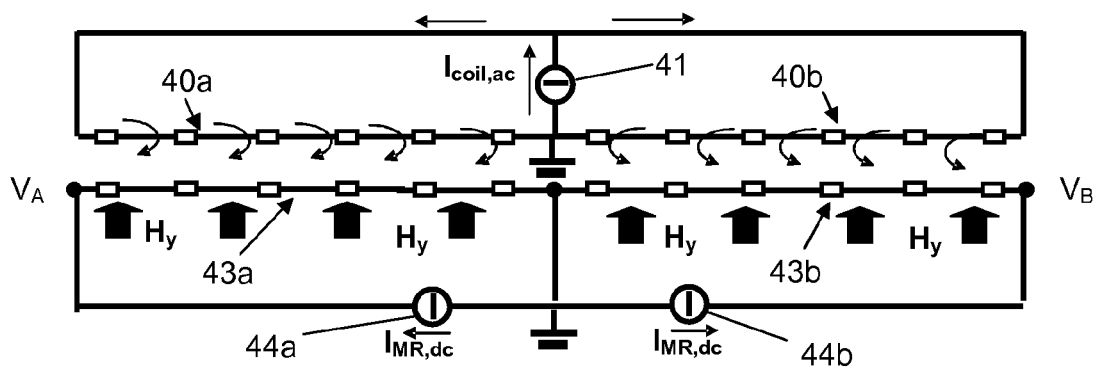

FIGS. 10a and 10b show schematics of two variants of the third embodiment.

The difference between the two variants of FIGS. 10a and 10b is simply that, in FIG. 10a the coil segments 40a and 40b for each of the first and second magnetoresistive sensor elements are provided with current by respective current sources 41a and 41b, whereas in FIG. 10b, each of the sets of coil segments 40a and 40b are provided with current by the same source 41. Functionally, this does not make a difference.

In both variants, the first and second magnetoresistive elements 43a and 43b are supplied with d.c. bias current by respective sources 44a and 44b coupled between a ground terminal and a respective output terminal. The output from the first magnetoresistive elements 43a is the voltage $V_A$, and the output from the second magnetoresistive elements 43b is the voltage $V_B$. The output from the sensor overall, is the difference between these, $V_A-V_B$.

The current flowing through the two sets of coil segments 40a and 40b causes a magnetic field to be generated as shown by the arrows in FIGS. 10a and 10b. This biases the magnetoresistive elements into their linear region of operation, and is mixed by the magnetoresistive elements with the external applied field, $H_y$.

The currents in the two sets of coil segments 40a and 40b are therefore mutually out-of-phase, meaning that at any particular moment they flow in opposite directions. The bias currents in the two magnetoresistive elements 43a and 43b have opposite directions too.

The voltages at the output terminals are: $V_A = I_{MR,dc} R_{MR1}$ and $V_B = I_{MR,dc} R_{MR2}$. So the output voltage is: $V_B - V_A = I_{MR,dc}(R_{MR2} - R_{MR1})$, where $I_{MR,dc}$ is the d.c. bias current flowing through the magnetoresistive elements 43a and 43b, $R_{MR1}$ is the resistance of the first magnetoresistive element 43a, and $R_{MR2}$ is the resistance of the second magnetoresistive element 43b.

It can be seen that this results in a non-zero response to an applied magnetic field, which is of course desired for a magnetic field sensor. It can also be seen that for similar reasons as mentioned above with respect to the first embodiment, a zero response to capacitive and inductive coupling is obtained.

Simulation shows that for zero external field, $H_y$, the voltage drop in the first magnetoresistive element 43a is equal in amplitude and opposite in sign to the voltage drop in the second magnetoresistive element 43b. For a non-zero external field a voltage difference $V_B - V_A$ appears, centred on 0V, with a slow-varying and a fast varying component, as described above.

Figure 11:
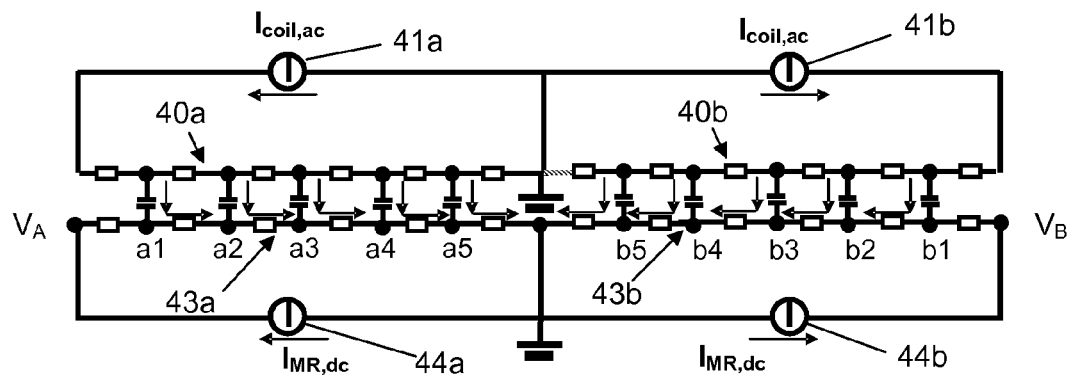
FIG. 11 shows the mechanism by which capacitive coupling is cancelled in the sensor of the third embodiment.

FIG. 11 illustrates the compensation mechanism for dealing with capacitive coupling in the second embodiment. The circuit is the same as in FIG. 10a, although the leakage currents due to capacitive coupling and the parasitic capacitance have been highlighted.

Due to the a.c. voltage difference between the coil segments 40a, 40b and magnetoresistive elements 43a, 43b, capacitive leakage currents arise where the magnetoresistive segments overlie corresponding segments of the coil. These currents seek their way to ground through the resistance of the magnetoresistive elements 43a, 43b and lead to voltage drops between the nodes a1-a5 as well as between nodes b1-b5. Due to the symmetry of the layout the voltage drop between a1 and a2 is exactly compensated by the voltage drop between b2 and b1. Similarly, the voltage drop between nodes a2 and a3 cancel with that between b2 and b3, and so on. In this way, the capacitive coupling is cancelled entirely and has no effect on the output voltage $V_B - V_A$. This has been confirmed by circuit simulation.

For full compensation, symmetry is essential. Thus, as with the first embodiment, the resistance of the two magnetoresistive elements 43a, 43b and their coupling with the coil must be the same. Both the magnetoresistive elements and the coil branches should be symmetrically arranged about the a.c. ground, and the coil current in each branch should be the same. The coil current in the segments that couple with the first magnetoresistive element must be out of phase with the current in those segments that couple with the second magnetoresistive element as discussed already.

Figure 12:
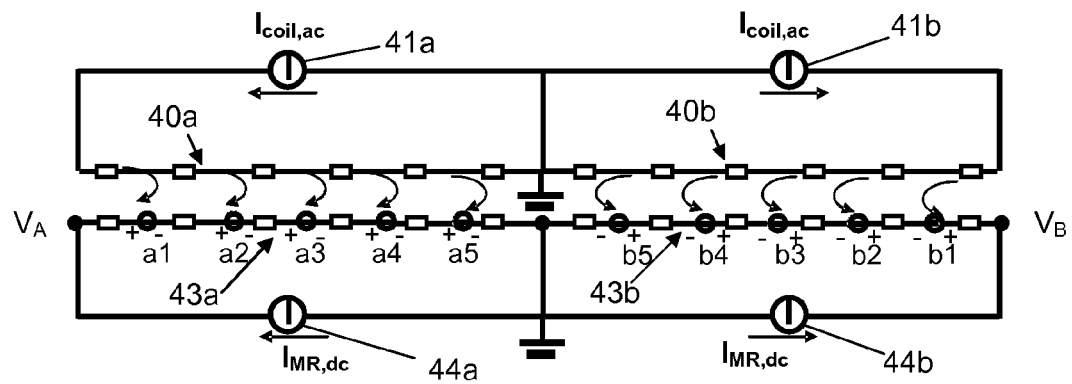
FIG. 12 shows the mechanism by which inductive coupling is cancelled in the sensor of the third embodiment.

FIG. 12 illustrates the cancellation of inductive coupling. Inductive coupling generates local voltages in the magnetoresistive elements 43a, 43b where the magnetoresistive segments overlie corresponding segments of the coil. The direction of the voltage drops is determined by the direction of the coil current. Since the coil current has opposite directions in the two halves of the circuit, the induced voltages in each of the first and second magnetoresistive elements 43a, 43b have opposite polarities. The total voltage contribution to the output voltage, $V_B - V_A$, is therefore zero. The effectiveness of this method has been shown in circuit simulation.

For efficient compensation of inductive coupling, the currents in the two coil branches 40a and 40b should be equal in amplitude and exactly out-of-phase, and the coupling coefficient (i.e. the mutual inductance) between each coil branch 40a and 40b and the associated magnetoresistive element 43a and 43b should be the same.

Figure 13:
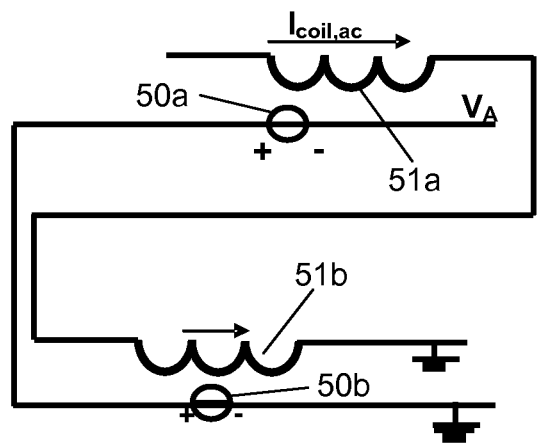
FIG. 13 shows a sensor according to a fourth embodiment of the invention, which causes cancellation of inductive coupling.

A fourth embodiment of the invention shown in FIG. 13 results in compensation of inductive coupling. In this embodiment, an even number of sensor segments is required in a magnetoresistive sensor element. In FIG. 13, two segments 50a and 50b are shown for ease of illustration. Many more would likely be used in a practical example. A corresponding coil segment 51a and 51b lies beneath (or above) segments 50a and 50b. The coil segments 51a and 51b are arranged so that an excitation current flows in the same direction through each segment 51a and 51b. The magnetoresistive segments 50a and 50b are configured such that a bias current flows in opposite directions in each magnetoresistive segment 50a and 50b.

When an a.c. current flows in the coil segments 51a and 51b, an inductive current is created in the corresponding magnetoresistive segments such that the magnetic field it creates opposes the change in the magnetic field created by the current in the coil segment (Lenz's law). Due to the arrangement of the coil segments 51a and 51b and the magnetoresistive segments 50a and 50b, the inductive currents created in the magnetoresistive segments cancel. This will occur for each pair of magnetoresistive segments arranged in this way.

An essential condition for this compensation scheme is that the current in the coil segments 51a and 51b is in the same direction. In the third embodiment, this is achieved by connecting them in series by means of a return line between the segments 51a and 51b, as shown in FIG. 12.

Alternatively the coil segments 51a and 51b could be connected in parallel. This would require less space, but comes with the disadvantage that it requires twice as much current to generate the same magnetic field.

The capacitance of the substrate on which the coil segments 51a, 51b and magnetoresistive segments 50a, 50b are placed can affect the effectiveness of the compensation between rows. This occurs if the excitation current in the coil has a spectral content with frequencies of the same order of magnitude as $1/(R_{MR}C_{sub})$ or higher, where $R_{MR}$ and $C_{sub}$ are the resistance of one magnetoresistive segment and $C_{sub}$ is the total capacitance of this segment to the substrate. It also occurs if the substrate has a forced potential (i.e. it is not floating). Such a potential can either be forced by direct connection to a fixed potential or it may be forced by the voltages on the magnetoresistive element and on the coil (e.g. symmetric layouts may force a virtual ground potential on the substrate).

If the AC signal content is known, the capacitance to the substrate can be decreased such that $1/(R_{MR}C_{sub})$ is well above the highest frequency occurring in the excitation current. Such a decreased capacitance can be obtained by increasing the thickness of the isolation layer between the magnetoresistive element and the carrier substrate.

The techniques presented above lead to the cancellation of induced voltages by layout only, which is simple and cheap to implement as well as being naturally very effective. Furthermore, the method for suppressing inductive coupling shown in FIG. 13 can be combined with any of the embodiments employing the superheterodyne principle or the differential superheterodyne principle for even stronger suppression of effects due to induced voltages.

Other variations to the disclosed embodiments can be understood and effected by those skilled in the art in practising the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. A magnetoresistive sensor comprising:
   first and second magnetoresistive elements, each of which is coupled at a respective first end to a common ground terminal and comprises at least one magnetoresistive segment, each overlying a corresponding segment of an excitation coil,
   wherein the resistance of the magnetoresistive segments in each of the first and second magnetoresistive elements is the same and the resistance of the segments of the excitation coil corresponding to the first magnetoresistive element is the same as the resistance of the segments of the excitation coil corresponding to the second magnetoresistive element, and
   wherein the or each magnetoresistive element is separated from a carrier substrate by an isolation layer, a thickness of the isolation layer being selected such that a product of the total resistance of the or each magnetoresistive element and the capacitance between the or each magnetoresistive element and the substrate is less than the reciprocal of a highest frequency in a spectrum of an excitation current carried by the excitation coil.

2. A magnetoresistive sensor according to claim 1, wherein the first and second magnetoresistive elements are identical.

3. A magnetoresistive sensor according to claim 1, wherein a second end of each of the first and second magnetoresistive elements is coupled to respective first and second output terminals.

4. A magnetoresistive sensor according to claim 1, wherein a bias current source for providing a bias current in the first and second magnetoresistive elements is coupled between the first and second output terminals.

5. A magnetoresistive sensor according to claim 1, wherein first and second bias current sources for providing a bias current in each of the first and second magnetoresistive elements respectively are coupled between the common ground terminal and a respective one of the first and second output terminals.

6. A magnetoresistive sensor according to claim 1, wherein the excitation coil is coupled at each end to an excitation current source for providing excitation current in the coil.

7. A magnetoresistive sensor according to claim 1, wherein the excitation coil is coupled at a midpoint along its length to a ground terminal.

8. A magnetoresistive sensor according to claim 7, wherein first and second excitation current sources for providing excitation current in the coil are coupled between the ground terminal and respective ends of the excitation coil.

9. A magnetoresistive sensor according to claim 1, wherein the first and second magnetoresistive elements comprise the same even number of magnetoresistive segments arranged in pairs, the magnetoresistive segments being configured such that each segment in a pair conducts a bias current in opposing directions, in use, and the excitation coil is configured such that the segments corresponding to the magnetoresistive segments of the first magnetoresistive element conduct an excitation current, in use, in an opposing direction to the segments corresponding to the magnetoresistive segments of the second magnetoresistive element.

10. A magnetoresistive sensor according to claim 9, wherein the first end of the first magnetoresistive element is coupled to the common ground terminal via a first ballast resistor and the second end of the second magnetoresistive element is coupled to the second output terminal via a second ballast resistor.

11. A magnetoresistive sensor according to claim 10, wherein the first and second ballast resistors have the same resistance value.

12. A magnetoresistive sensor, comprising:
    first and second magnetoresistive elements, each of which is coupled at a respective first end to a common ground terminal and comprises at least one magnetoresistive segment, each overlying a corresponding segment of an excitation coil,
    wherein the resistance of the magnetoresistive segments in each of the first and second magnetoresistive elements is the same and the resistance of the segments of the excitation coil corresponding to the first magnetoresistive element is the same as the resistance of the segments of the excitation coil corresponding to the second magnetoresistive element, and
    wherein the excitation coil comprises first and second excitation coil elements electrically coupled in parallel, the magnetoresistive segments of the first and second magnetoresistive elements overlying a respective one of the first and second excitation coil elements.

13. A magnetoresistive sensor, comprising:
    first and second magnetoresistive elements, each of which is coupled at a respective first end to a common ground terminal and comprises at least one magnetoresistive segment, each overlying a corresponding segment of an excitation coil,
    wherein the resistance of the magnetoresistive segments in each of the first and second magnetoresistive elements is the same and the resistance of the segments of the excitation coil corresponding to the first magnetoresistive element is the same as the resistance of the segments of the excitation coil corresponding to the second magnetoresistive element, and
    wherein each of the first and second magnetoresistive elements comprises the same number of magnetoresistive segments configured such that adjacent magnetoresistive segments in the same magnetoresistive element conduct a bias current in opposing directions, in use, and the excitation coil is configured such that each of its segments conduct an excitation current in the same direction, in use.

14. A magnetoresistive sensor comprising a magnetoresistive element, coupled at a first end to a ground terminal and comprising one or more pairs of magnetoresistive segments, each overlying a corresponding segment of an excitation coil, wherein the excitation coil is configured such that, in use, an excitation current flows in the same direction through each segment of the excitation coil and the or each pair of magnetoresistive segments is configured such that a bias current flows in opposite directions in each magnetoresistive segment of the pair.

* * * * *